(12) United States Patent
Chishti et al.

(10) Patent No.: US 9,324,430 B2
(45) Date of Patent: Apr. 26, 2016

(54) METHOD FOR DEFINING A DEFAULT STATE OF A CHARGE TRAP BASED MEMORY CELL

(71) Applicant: GLOBALFOUNDRIES INC., Grand Cayman (KY)

(72) Inventors: Sheikh Sabiq Chishti, Imphal (IN); Toshiaki Kirihata, Poughkeepsie, NY (US); Krishnan S. Rengarajan, Bangalore (IN); Deepal Wehella-Gamage, Newburgh, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/265,409

(22) Filed: Apr. 30, 2014

(65) Prior Publication Data
US 2015/0318043 A1 Nov. 5, 2015

(51) Int. Cl.
*G11C 16/04* (2006.01)
*G11C 16/10* (2006.01)
*G11C 16/28* (2006.01)

(52) U.S. Cl.
CPC .......... *G11C 16/0466* (2013.01); *G11C 16/10* (2013.01); *G11C 16/28* (2013.01)

(58) Field of Classification Search
CPC ..... G11C 16/0466; G11C 16/10; G11C 16/28
See application file for complete search history.

(56) References Cited

U.S. PATENT DOCUMENTS

| | | | | |
|---|---|---|---|---|
| 4,599,704 A * | 7/1986 | Mazin | ........................... | 365/104 |
| 5,089,866 A * | 2/1992 | Iwasa | ............................... | 257/69 |
| 5,646,885 A * | 7/1997 | Matsuo et al. | ........... | 365/185.05 |
| 5,862,082 A * | 1/1999 | Dejenfelt et al. | ........ | 365/185.33 |
| 5,914,514 A * | 6/1999 | Dejenfelt et al. | ............. | 257/322 |
| 6,265,266 B1 * | 7/2001 | Dejenfelt et al. | ............. | 438/258 |
| 6,363,016 B1 * | 3/2002 | Lin et al. | .................. | 365/185.27 |
| 2006/0013041 A1 * | 1/2006 | Lin | .......................... | 365/185.05 |
| 2008/0008019 A1 * | 1/2008 | Balasuramanian | ........... | 365/208 |
| 2013/0028002 A1 * | 1/2013 | Liu | .............................. | 365/104 |
| 2015/0029778 A1 * | 1/2015 | Yoon et al. | ..................... | 365/104 |

* cited by examiner

*Primary Examiner* — J. H. Hur
(74) *Attorney, Agent, or Firm* — Scully, Scott, Murphy & Presser, P.C.

(57) ABSTRACT

A method of generating a default state in an embedded Multi-Time-Programmable-Read-Only-Memory for a high-performance logic technology consisting of a plurality of memory cells featuring a charge trap, each having a first and a second NMOS transistor. The first and second NMOS transistors use a different mask having different threshold voltages. The second NMOS threshold voltage is adjusted to a middle point of the threshold voltage of the first NMOS with or without trapping the charge. When the charge is not trapped by the first NMOS, the NMOS threshold is lowered to the second NMOS, thereby generating a default state. When the charge is trapped to the first NMOS, the NMOS threshold is higher than the second NMOS, generating a second state. Moreover, a reference voltage generation can use two arrays, each consisting of memory cells and reference memory cells such that a default state can be generated for a single transistor per memory cell.

7 Claims, 11 Drawing Sheets

METHOD FOR DEFINING A DEFAULT STATE OF A CHARGE TRAP BASED MEMORY CELL

FIELD OF THE INVENTION

The invention is related to an embedded Multi-Time-Programmable-Read-Only-Memory (eMTPROM) for high-performance logic technology. More particularly, a method is provided to design an eMTPROM using a charge trap behavior for Metal-Oxide-Semiconductor-Field-Effect-Transistor (MOSFET) having a default state before programming the charge trapped based memory cell.

BACKGROUND

A conventional approach to embedded non-volatile memory uses an electrical fuse (hereinafter referred to as eFUSE) that is rapidly becoming unfavorable regarding its area efficiency as the technology continues to scale down. Furthermore the eFUSE does not allow reprogramming data bits, resulting in a one time programmable ROM. High density nonvolatile memory such as a NAND or NOR type flash memory overcomes the problem. However, inherently adding undesirable device structures such as a floating gate or ultra-thick oxide and electrical parasitics (i.e., excessive capacitance, high voltages, typically greater than 5V) are not supported in a high performance logic technology. This requires adding complex additional process elements to be integrated to the high-performance logic technologies, resulting in a high cost.

The prior art uses a charge trap of an N-type MOSFET (NMOS) without using a floating gate, resulting in an embedded Multi-Time-Programmable-Read-Only-Memory (eMTPROM) for a high-performance logic technology. However, the eMTPROM does not have a default state such as 0 that requires programming the bit prior to use. As a result, the prior art does not support the technology for One-Time-Programmable-Read-Only using a charge trap behavior. Even when the technology supports multiple writes, it becomes difficult to use a memory because certain applications require a default state prior to using it. Typically, the number of the eMTPROM programming features is limited to less than 10, and therefore uses one of the limited programming cycles for creating a default state that can make the product less attractive. Furthermore, even when the application does not require a default state, all the bit cells need to be programmed, resulting in a undesired power consumption and a longer programming time.

SUMMARY

Accordingly, an embodiment of the invention provides a method for generating a default state in an embedded Multi-Time-Programmable-Read-Only-Memory (eMTPROM) for a high-performance logic technology, the eMTPROM including an N-type Metal-Oxide-Semiconductor-Field-Effect-Transistor (NMOS) array consisting of a plurality of cells, each having a first NMOS with a first threshold voltage (VT1) and a second NMOS having a second threshold voltage (VT2) higher than the VT1, such that a default state is determined by using first and second threshold voltages (VT1 and VT2) of the NMOS pair without trapping either one of the NMOS pair.

In a first preferred embodiment, the method includes trapping the charge of only one, i.e., preferably the first of the NMOS of the pair thereof, to switch the state from the default state to the second state by increasing the threshold voltage to a third voltage, wherein VT3 is higher than VT2.

In a second preferred embodiment, the method creates a default state including a first and a second sub-array, each of which consisting of a plurality of memory cells coupled to wordlines, and further to at least one reference wordline coupled to a plurality of reference memory cells, wherein the memory cell and the reference memory cells have different threshold voltages.

More particularly, a single NMOS transistor is used for the memory cell and for the reference memory cell, wherein the memory cell has a threshold voltage lower than the reference memory cell when the memory cell does not trap a charge, but having a threshold voltage of the memory cell greater than the reference memory cell when the memory cell traps the charge. For an actual implementation, the wordline is coupled to the memory cell in the first array and the wordline is coupled to the reference memory cells in the second array activated simultaneously, developing a differential signal on the bitline coupled to the first array and on the bitline coupled to the second array, developing a differential voltage of the bitline pair. Developed differential voltages are detected by a differential sense amplifier, outputting a default state or a second state.

A third preferred embodiment provides a method of creating a default state including a first and a second sub-array, each consisting of a plurality of memory cells coupled to the wordlines, and at least one reference wordline coupled to a plurality of reference memory cells. With the memory cells and reference memory cells having the same threshold voltages, the state of the trapped or untrapped states of the memory cell is detected by enabling the activation of the wordline coupled to the memory cells of the first array to a first wordline voltage, and likewise enabling the activation of the reference wordline coupled to the reference memory cells of the second array to a second wordline voltage, developing a first bitline voltage on the corresponding bitline of the first array, and a second bitline voltage on a corresponding bitline of the second array, wherein the second wordline voltage is lower than the first wordline voltage. The corresponding bitlines of the first and second arrays are coupled to a differential sense amplifier, outputting a first state for the untrapped memory cell, and a second state for trapping the memory cell or vise versa. The method further can include a signal margin detection by increasing or reducing the difference of the first wordline voltage and the second wordline voltage.

In another aspect, an Embedded Multi-Time-Read-Only-Memory (eMTPROM) includes an N-type Metal-Oxide-Semiconductor-Field-Effect-Transistor (NMOS) array consisting of a plurality of cells, each of the cells provided with a first NMOS having a first threshold voltage (VT1) and a second NMOS having the first threshold voltage (VT2), wherein the VT2 is higher than VT1.

BRIEF DESCRIPTION OF THE DRAWINGS

The present disclosure will be understood and appreciated more fully from the following detailed description of embodiments of the invention, taken in conjunction with the accompanying drawings.

DETAILED DESCRIPTION

Embodiments of the methods of the present disclosure are described herein; however, it is to be understood that the disclosed embodiments are merely illustrative of the described methods that can be embodied in various forms. In addition, each of the examples given in connection with the various embodiments of the disclosure is intended to be illustrative, and not restrictive.

Figure 1:
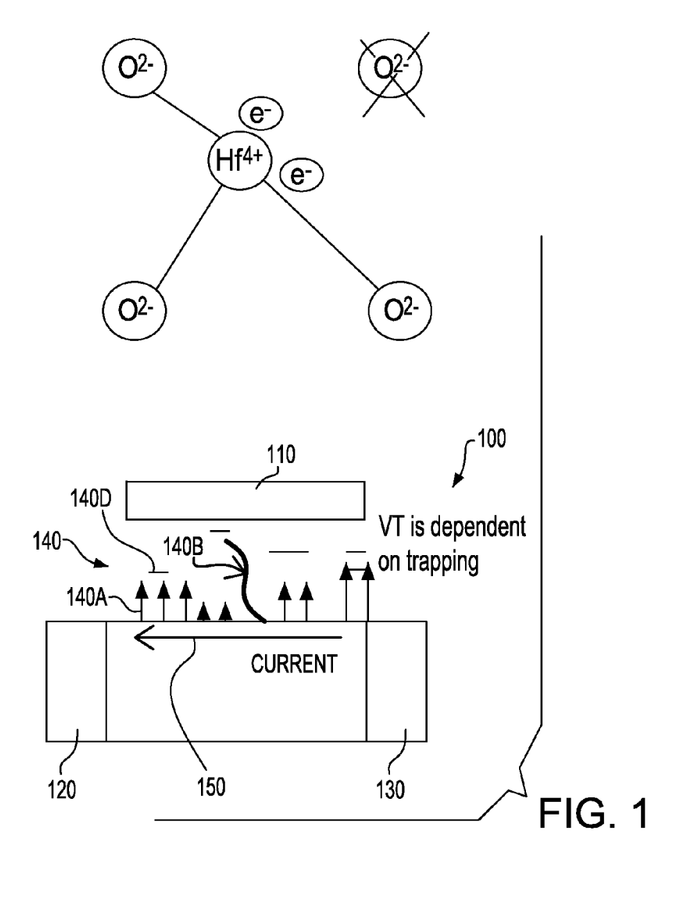
FIG. 1 illustrates the physics of an NMOS showing a charge trap.

A high performance NMOS with a high-K dielectric, e.g., Hafnium ($Hf_4$) oxide, shows a charge trap behavior. Referring to FIG. 1, NMOS (100) has an initial threshold voltage of $VT_0$. The vacant oxygen point (140D) in the $Hf_4$ oxide (140) trapping electrons (140A) in accordance with a conditional set that applies a high voltage to the gate (110), and that applies a high voltage between the source (120) and the drain (130) such that the NMOS strongly turns on to flow a large current through the channel (150). The trapped charge (e−) increases the NMOS threshold voltage to $VT_1$ (=$VT_0+\Delta VT$). The trapped electrons (e−) (140B) can be eliminated by applying a negative voltage between the gate (110) and the source (120), resulting in recovering the $VT_0$ condition.

Figure 2:
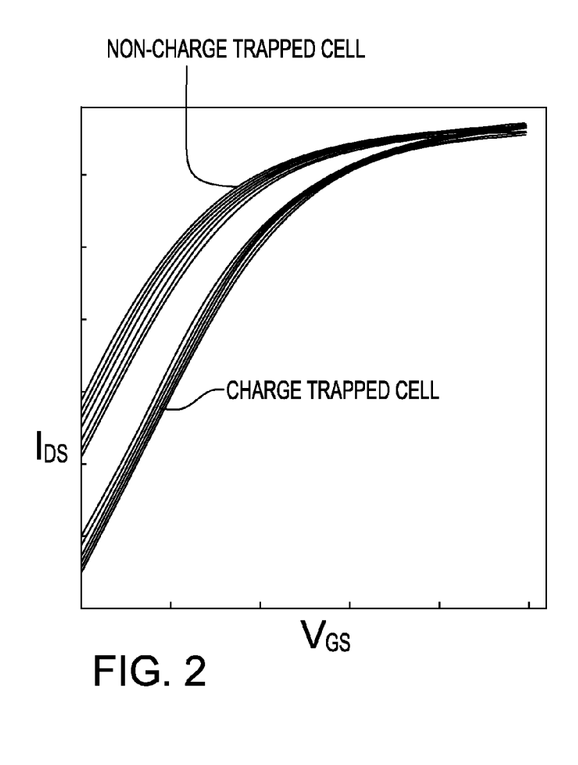
FIG. 2 depicts a measured source to drain current (IDS) with respect to the gate to source voltage (VGS) of THE NMOS transistor.

FIG. 2 shows a measured source to drain current (IDS) with respect to the gate to the source voltage (VGS) of the $Hf_4$ NMOS transistor (100). The IDS can be measured while applying a programming and resetting conditions several times. As it is expected, trapping electrons increases the NMOS threshold which results in a current smaller than that without trapping. The voltage VT1 of the charge trapped NMOS can be successfully reset to the $VT_0$ of a non-charge trapped NMOS. The charge-trap based embedded Multi-Time-Programmable-Read-Only-Memory (eMTPROM) uses $VT_0$ and $VT_1$ for data bits 0 and 1.

Figure 3:
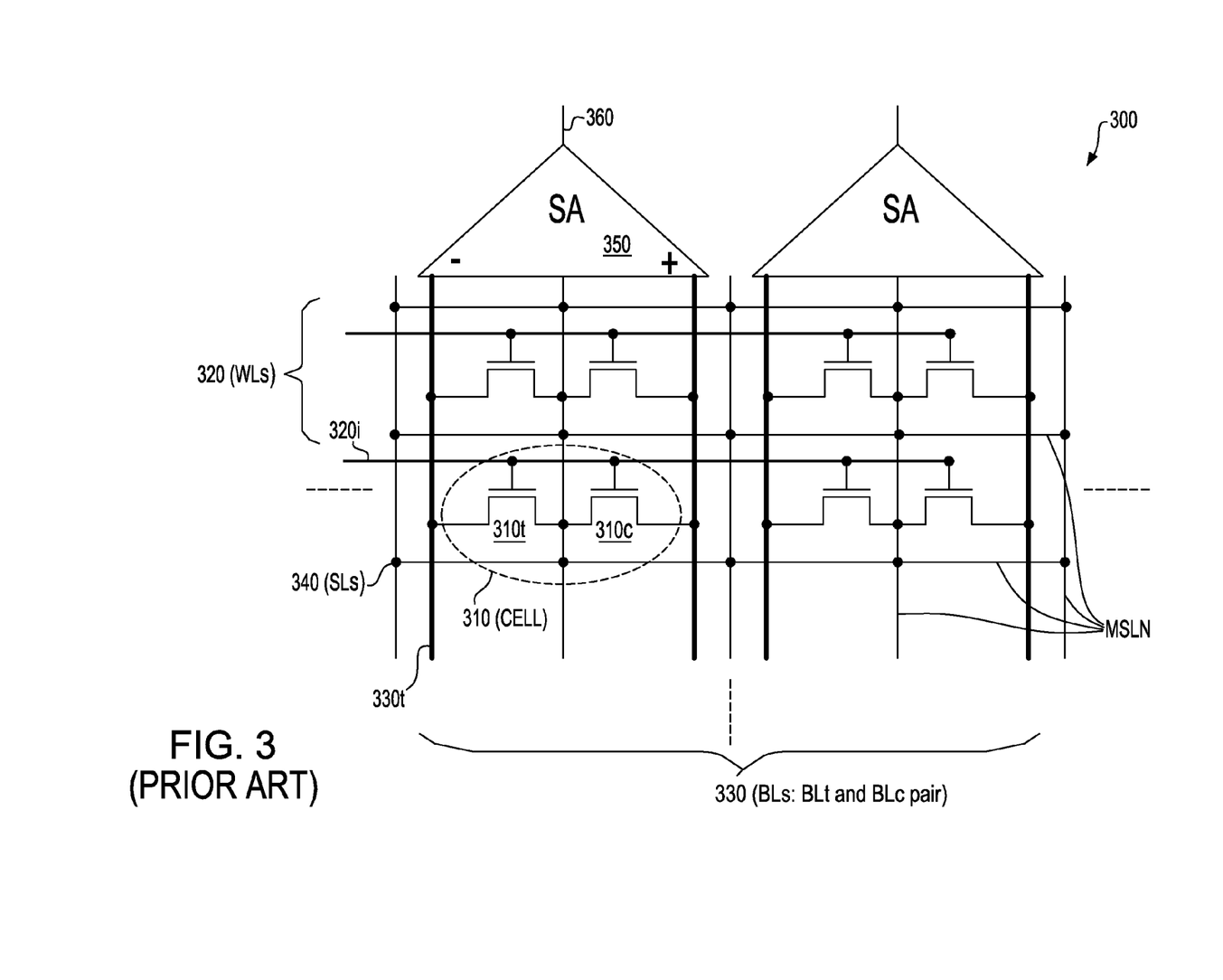
FIG. 3 shows a prior art of an array structure of a Multi-Time-Programmable-Read-Only-Memory (eMTPROM).

FIG. 3 shows a prior art eMPROM array (300), consisting of a plurality of charge trap memory cells (310), each consisting of a pair of NOMS (310t and 310c) supported by wordlines ((320) WLs) and a bitline pair (330t and 330c) for selecting respectively the row and the column of the cells. Data bits are stored by trapping a charge to one of the NMOS of the pair (310t and 310c). More particularly, a data bit of 0 is written by trapping a charge to the NMOS 310c while maintaining the untrapped state for the NMOS (310t). Likewise, this can be realized by activating the corresponding wordline (i.e. 320i) to 2V and by discharging the bitline (330c) to GND, while raising the meshed source-line (SL) network (MSLN) to 1.5V. The other bitline (330t) maintains the MSLN voltage at 1.5V, resulting in a large current only to the NMOS (310c), and trapping the charge to the NMOS (310c) without trapping the charge to NMOS (310t). Similarly, a data bit 1 is obtained by trapping a charge for the NMOS 310t while keeping the untrapped charge state for the NMOS (310c). Again, this can be realized by activating the corresponding wordline (320i) to 2V and discharging the bitline (330t) to GND while raising the MSLN to 1.5V. The other bitline (330c) maintains the SL voltage at 1.5V, resulting in a large current only to the NMOS (310t), and trapping the charge to the NMOS (310t) without trapping the charge to NMOS (310c). It is noted that charge trapping for programming requires high voltages applied to the corresponding wordline (2V WL), and the MSLN (1.5V) needs a high power as large as ~0.5 mW per bit. In order to trap the charge sufficiently, the programming time for each bit requires >10 ms, resulting in >5 µJ per bit.

When in a read mode, a wordline (i.e. WL 320i) is activated to the voltage VDD and by applying SL to VDD. Then, both BLs (330t and 330c) are weakly discharged. This results in creating a differential voltage to the BL pair (330t and 330c). If BL discharges its strength to a level sufficiently low (weak), the differential voltage will be close to the VT determined by the charge trap. The differential voltage is sensed by a differential sense amplifier (SA 350), resulting in generating a digital bit (350) as an output of the sense amplifier. For a cell strong 0, the output is 0. For the cell strong 1, the output stands at 1.

In the prior art, it is known that a charge needs to be trapped to one of each NMPOS pair for programming data bits. For a 64 Kb eMTPROM, it is required to trap the charge for all 64 Kb bit cells prior to use. This results in 10 s while using >320 mJ for 64 bit parallel programming. The programming overhead further increases as the density increases. Even for 64 Kb, the technology may require a longer programming time or a higher voltage. Therefore, there is a strong need to create a default state (predetermined state such as a logical state of 0 or 1 devoid of charge trapping in the eMTPROM application.

Figure 4A:
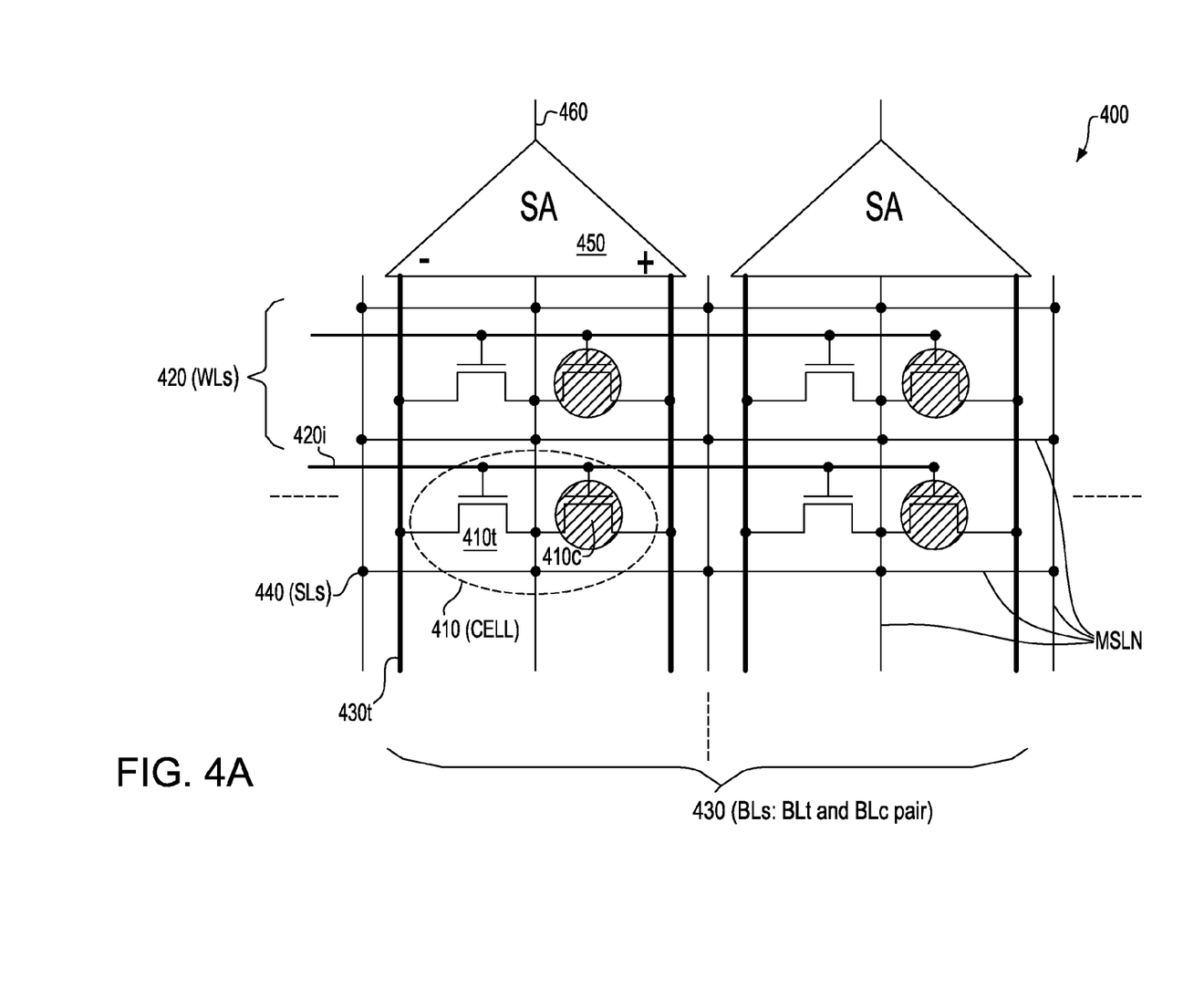
FIG. 4A illustrates the array structure of the eMTPROM in accordance with a first preferred embodiment.

FIG. 4A shows a first preferred embodiment of the eMTPROM array structure for supporting a default state. The array consists of a plurality of charge trap memory cells (400), each consisting of a pair of NOMS (410t and 410c) supported by the wordlines ((420) WLs) and by a bitline pair (430t and 430c) for selecting, respectively, a row and a column for the cells. Unlike the prior art, the NMOS 410c has a higher threshold voltage than NMOS (410t). This can be realized by using a different implant mask for the 410c to increase VT, preferably during manufacturing that results in a default state of 0 without trapping a charge. Write 1 is obtained by trapping a charge to the NMOS (410t) which is obtained by activating the corresponding wordline (420i) to 2V and discharging the bitline (430t) to GND while raising SL (440) or MSLN to 1.5V. The other bitline (430c) maintains SL at 1.5V resulting in a large current only to the NMOS (410t), trapping the charge to the NMOS (410t) without trapping the charge to the NMOS (410c). When VT of NMOS (410t) increases more than the VT of the NMOS (410c), the data bit turns to 1.

When in a read mode, preferably wordline WL 420i is activated to VDD, applying SL (440) to VDD. Then, both BLs (430t and 430c) are weakly discharged, leading to generating a differential voltage of the BL pair (430t and 430c). If the BL discharge strength is adequately low (weak), the differential voltage closes VT determined by the charge trap. The differential voltage is sensed by a differential sense amplifier (SA 450), generating a digital bit (460) as an output of SA. For a cell strong 0, the output is 0 because VT of the NMOS (410c) is higher than that of the NMOS (410t). The threshold is preferably determined during manufacturing. For a cell strong 1, the output is 1 since VT of the NMOS (410t) is higher than that of the NMOS (410c) in view of the charge trapping.

Figure 4B:
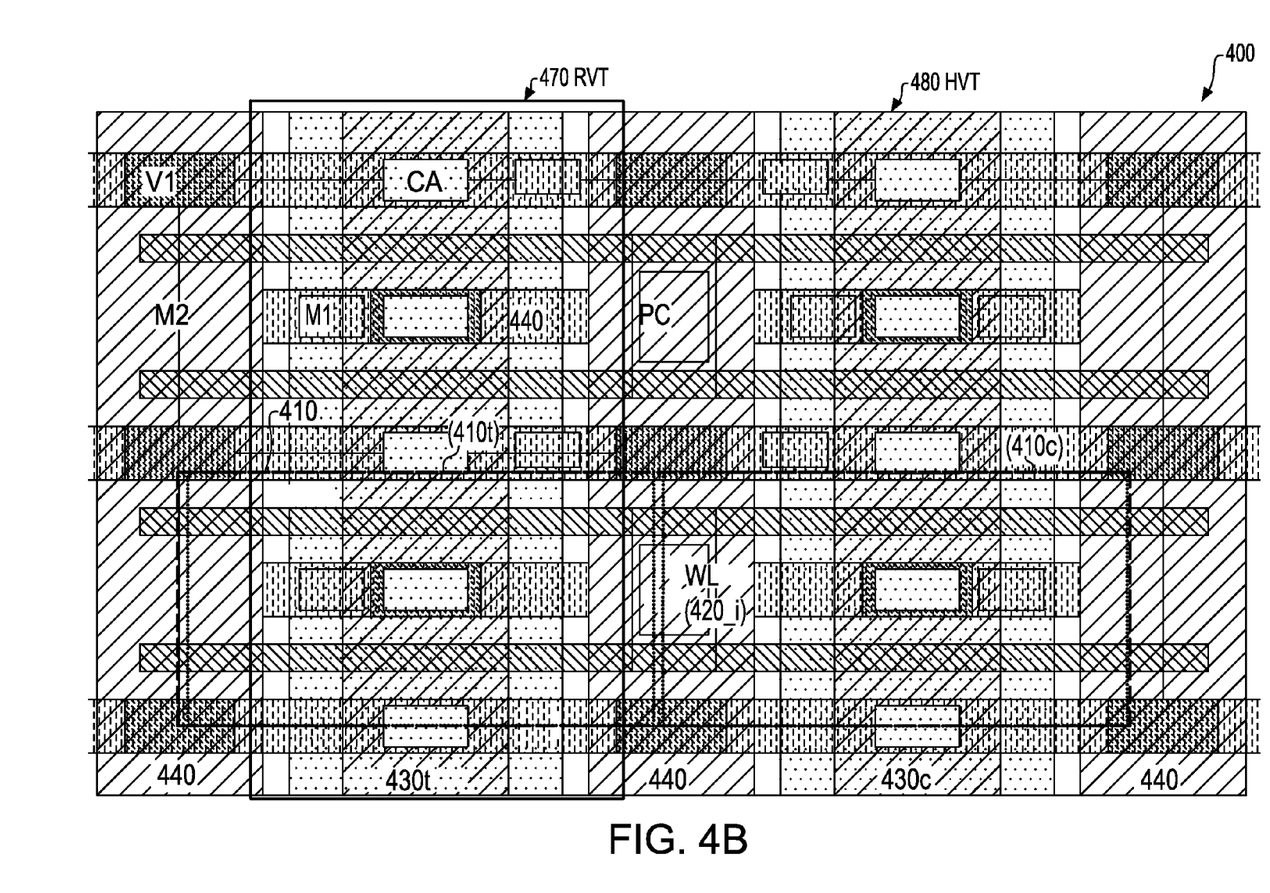
FIG. 4B shows a mask layout of the array structure of the eMTPROM for the first preferred embodiment.

Referring the FIG. 4B, the mask layout (one column and two rows) of the preferred embodiment is shown, wherein the NMOS (410t) is a regular VT device and the NMOS cell (410c) is a high VT device, as described in FIG. 4A. NMOS (410t and 410c) are built by using a regular VT regular VT mask (470 RVT), and a high VT mask (480 HVT), respectively. The target RVT and HVT threshold ranges between 100 and 150 mV to create the target differential voltage (100 mV~150 mV) on the BL pair during the sense operation without trapping a charge to the NMOS (410t and 410c). All the cells (410) in each row are coupled to the same wordline (i.e., 420i) running in a first direction parallel to the gate poly (PC). A third metal M3 (not shown) runs over a contiguous PC and is stitched at the array break to reduce the polysilicon gate delay time constant. The left side of two NMOS is coupled to the same true bitline (430t) having the right side of the two NMOS coupled to the same complement bitline (430c). The BLs run in to (a second direction) orthogonally to WLs' (i.e., in the first direction) using the second metal (M2). Source lines (SL: 440) of the entire array are meshed to create a Meshed Source-Line Network (MSLN). Optionally, NMOS (410c) can use a regular VT mask (470RVT), in which case, the threshold voltage of the NMOS (410) should be programmed by the charge trap similar to a conventional charge trap memory cell preferably during manufacturing. This results in a default state in a filed without programming.

Figure 5:
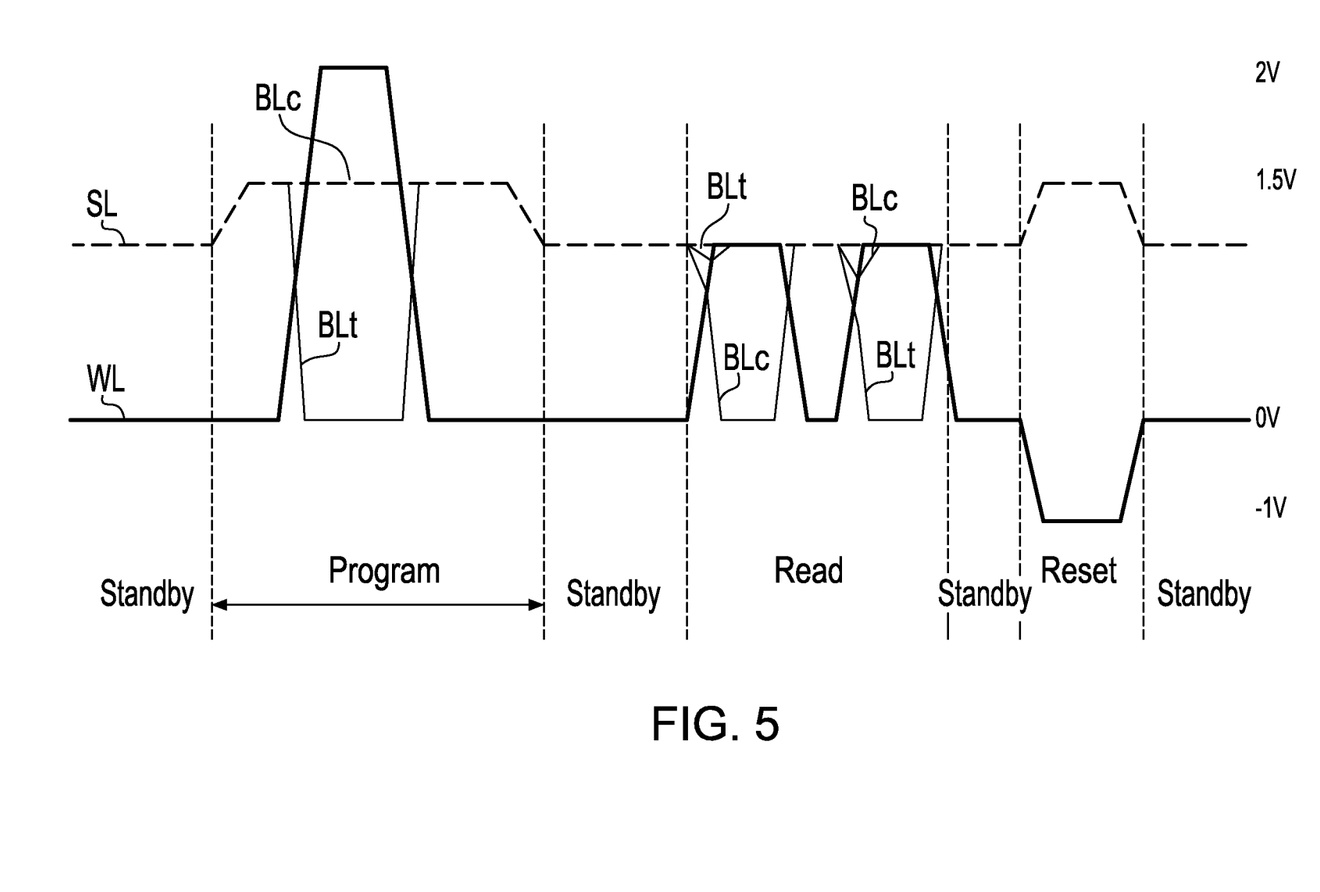
FIG. 5 shows a timing diagram applied to FIG. 4.

Referring a FIG. 5, a timing diagram of wordline (WL), source-line (SL or MSLN), bitline (BLt), bitline complement (BLc) for standby, program, read, and reset modes are shown. The standby state uses WL at GND while keeping SL, BLt and BLc at VDD (1V). There is no need to write 0 because the default state is 0 for all the cells. Prior to the programming activation, SL, BLt and BLc are raised to 1.5V. For writing one to the corresponding cell, corresponding WL and BLt are activated to wordline high voltage (VWLH=2V), and GND resulting in a high current to the corresponding cell selected by WL and BLt trapping a charge to NMOS (410t) coupled to BLt. The other BLc remains at 1.5V, keeping the non-charge trapped state in the NMOS (410c) of the corresponding NMOS pair (cell). Following the programming, the array returns to a standby state.

The read mode is enabled by activating the corresponding WL. Both BLs (BLt and BLc) are weakly discharged. As previously described, this can result in generating a differential signal. When NMOS (410t) is in a non-trapped state, BLc goes down (0 data bit read) when activated by a differential sense amplifier (e.g., in a cross-coupled sense amplifier) caused by NMOS (410c) having a higher threshold voltage than NMOS (410t). If NMOS (410t) traps a charge to increase the threshold voltage higher than NMOS (410c), BLt goes down (1 data bit read). The target of threshold voltage increase should be twice the initial threshold voltage difference of 100 mV~150 mV determined by HVT and RVT masks. The target of the VT increase should be therefore 200 mV~300 mV.

Figure 6:
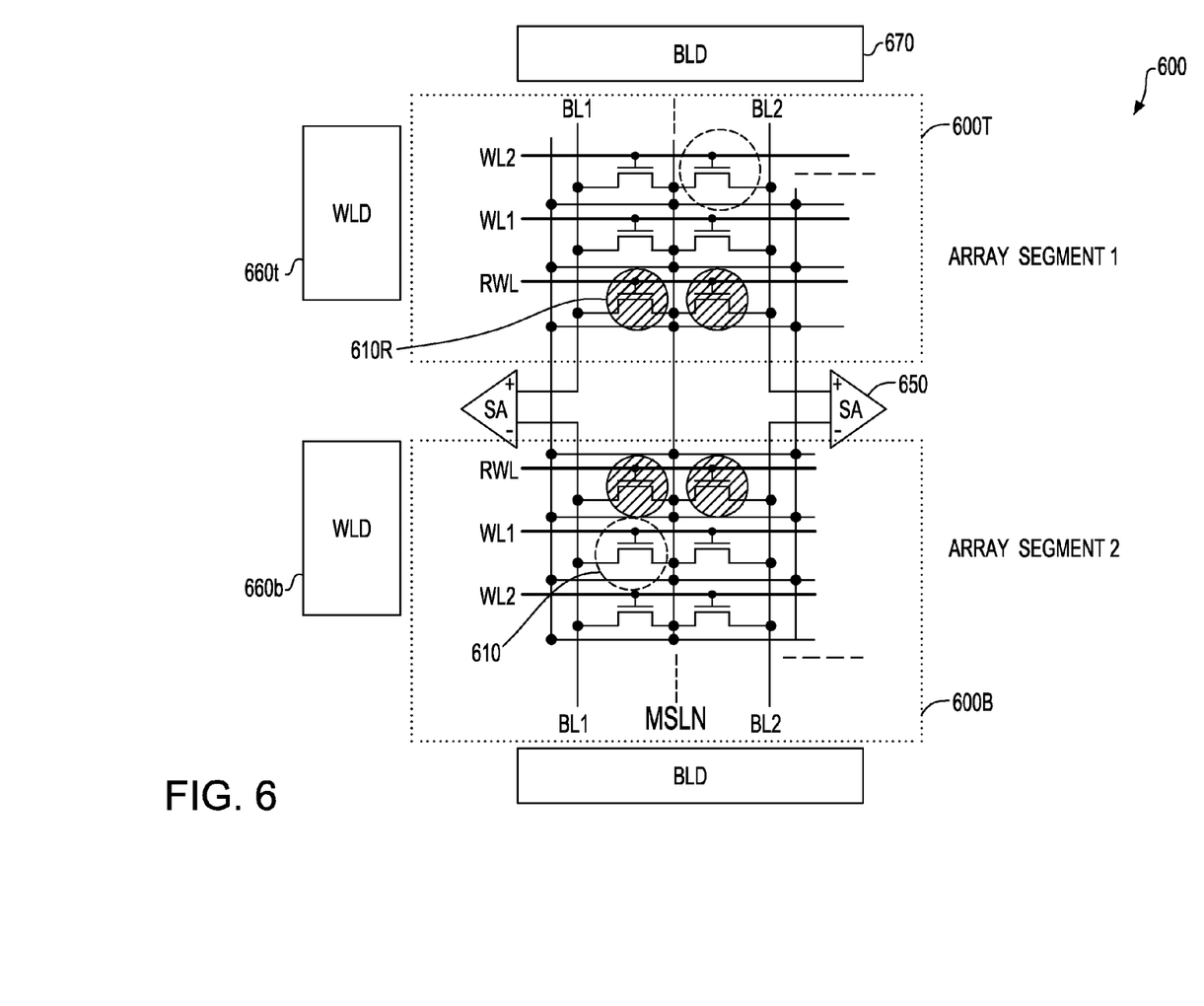
FIG. 6 illustrates the array structure of the eMTPROM according to a second preferred embodiment.

FIG. 6 illustrates the aforementioned second preferred embodiment to enable a default state. Unlike the aforementioned first preferred embodiment, using two NMOS transistors per memory cell, the second approach uses a single NMOS transistor per memory cell, improving the density. More particularly, the eMTPROM array (600) consists of two sub-arrays (600T and 600B) wherein each sub-array consists of a plurality of memory cells each consisting of a single NMOS transistor (610). The NMOS in each sub-array (600T and 600C) is supported by wordlines (WLs) and bitlines (BLs) for selecting the row and the column of the cells, respectively. Furthermore, each array consists of a reference wordline (RWL) coupled to a reference NMOS (610R), with each coupled to a corresponding BL. The threshold voltage of reference NMOS (610R) uses a reference threshold voltage (VTR) higher than for the initial threshold voltage (VT0) of NMOS (610), which is a non-trapped state. This can be realized by using a different implant mask for the reference NMOS (610R) to increase the VT, preferably set during manufacturing. More particularly, the VTR of the reference NMOS is adjusted to the middle point of the initial threshold voltage (VT0) of NMOS(610) without trapping a charge (0 state) and the programmed threshold voltage (VT1) of NMOS(610) when trapping a charge (1 state) that results in generating a reference voltage on the bitline when RWL is activated in one of the array (i.e. 600T), while activating WL in the other array (600B). Details thereof are further described hereinafter.

A write 1 (or programming 1) is realized by trapping a charge to NMOS (610), and can be realized by activating the corresponding wordline (610) to 2V, and discharging the bitline (i.e., BL1) to GND while raising the meshed-source-line-network (MSLN) to 1.5V. The unprogrammed bitline (i.e., BL2) maintains the MSLN voltage at 1.5V, resulting in a large current only to the NMOS (i.e. BL1), trapping the charge to the selected NMOS without trapping the charge to the unselected NMOS in the sub-array.

For a read mode, a wordline (i.e. WL1) is activated to VDD by one of the arrays (600B). A reference wordline (RWL) is activated by the second array (600T). The pair of BLs (i.e. BL1) in both arrays is weakly discharged. The MSLN in read mode is 1V that results in generating a differential voltage of the pair of BL. If the BL discharge strength is sufficiently low (weak), the differential voltage between the pair of BLs can end close to the VT0-VTR for a 0 state, and VT1-VTR, respectively. The differential voltage is sensed by a differential sense-amplifier (SA 650) coupled to the BLs from the top and bottom sub-array such that the output of SA is converted to 1 for the NMOS with trapping the charge and 0 for the NMOS without trapping a charge (default state), respectively. Additional bit flip function after the SA output may be required to match the data polarity for accessing the sub-array (600T), which is well known in the art, and therefore not discussed.

Figure 7:
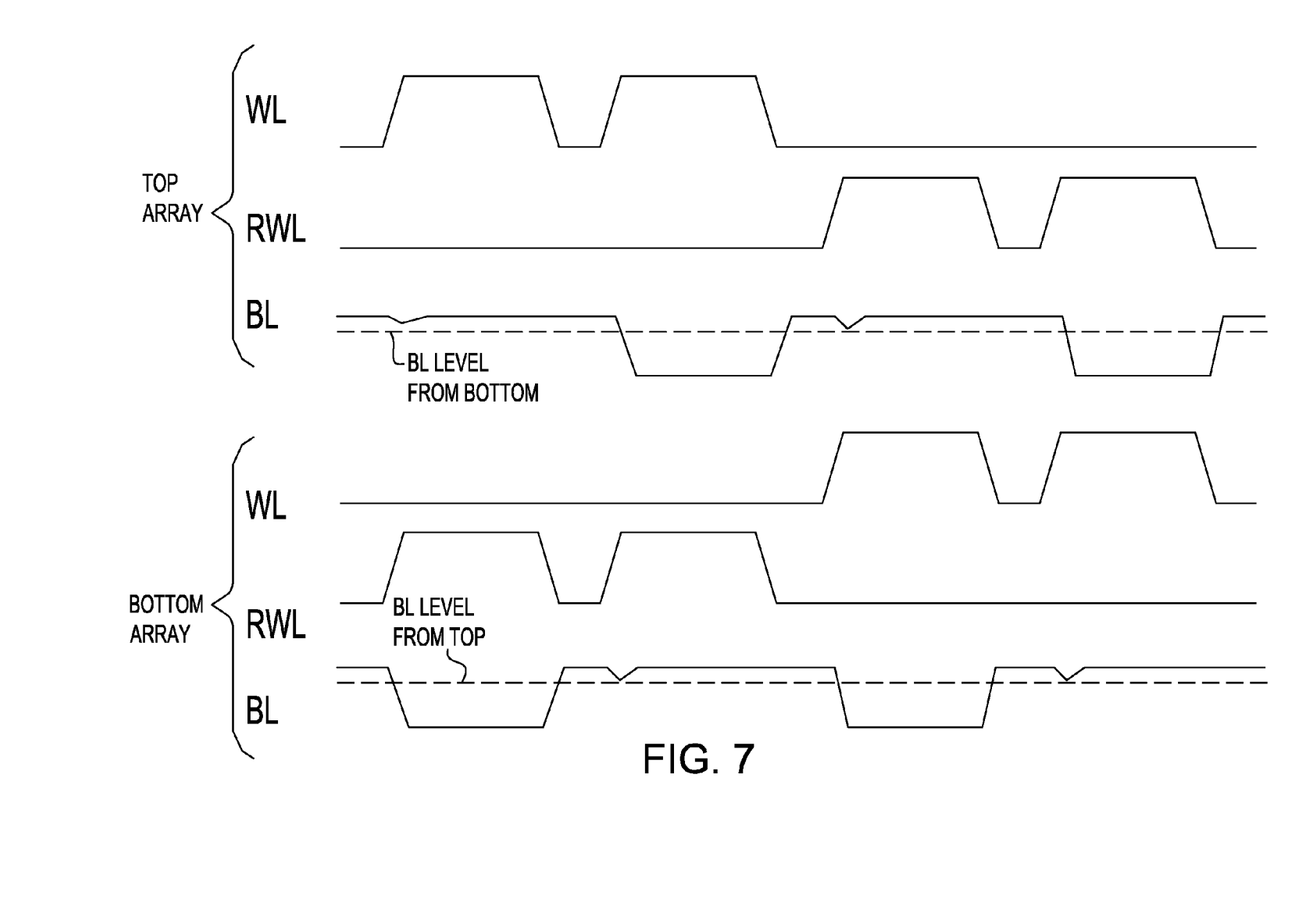
FIG. 7 illustrates the timing diagram shown in FIG. 6.

FIG. 7 shows a timing diagram for accessing the memory cells of the top sub-array (600T) for 0 and 1 followed by accessing the memory cells of the bottom sub-array (600B) for 1 and 0. The key feature is to activate WL in one of the two arrays and RWL in the second of the pair, wherein RWL in the second array creates a reference bitline voltage for sensing the bitline voltage developed by the WL activation in the activated array.

Figure 8:
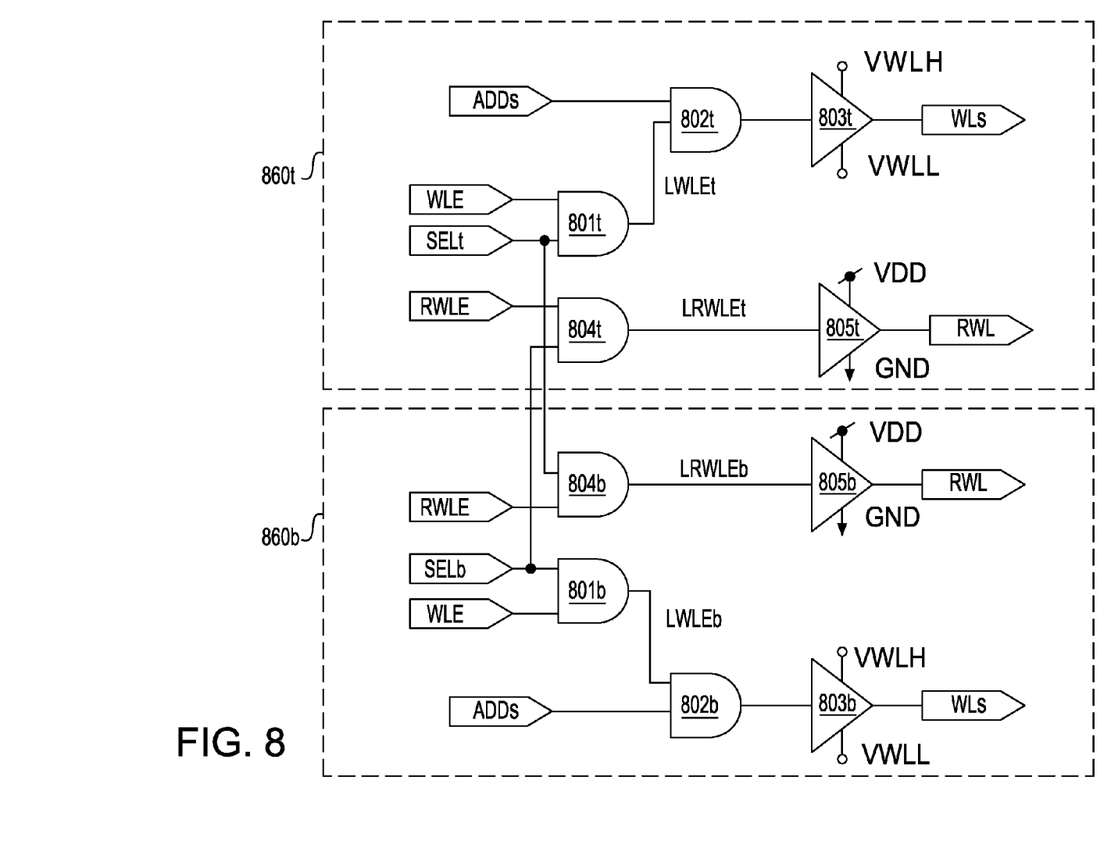
FIG. 8 is a detailed schematic for controlling the wordline (WL) and reference wordline (RWL) in sub-arrays (600T and 600B), shown in FIG. 6.

FIG. 8 shows a control circuit schematic, wherein circuits (860t and 860b) control the top and bottom sub-arrays (660t and 660c in FIG. 6), respectively. More particularly, circuits (860t and 860b) located in the wordline driver block (660t and 660c in FIG. 6) control the wordlines (WLs) and the reference wordline (RWL) of the top and bottom array. The addresses (ADDs), the wordline enable signal (WLE), the reference wordline enable signal (RWL) are used for activating the corresponding WL and RWL in sub-array selected by the corresponding signal (SELt and SELt). More particularly, for reading the bottom, array, a signal SELb goes high. This results in making AND (810b) output (LWLEb) high when WLE goes high. The AND (802b) of the selected ADDs goes high, activating a wordline driver (830b) making the corresponding WL high. For a read mode, the wordline high voltage (VWLH) and wordline low voltage (VWLL) are 1V and 0V, respectively, resulting in activating the selected WL to 1V, while keeping un-selected WLs at 0V. Concurrently, RWL in the top array goes high (VDD=1V) when RWLE goes high, because AND (804t) couples to signal SELb. WLs in the top sub-array (600T) and RWL in the bottom array (600T) are not activated or can be kept at 0V because the signal SELt is low. In conclusion, the control circuit controls the top and bottom arrays such that the WL in one of the two arrays and RWL in the other are activated as a pair.

The reset operation can be realized by lowering VWLL to −1V, while maintaining MSLN and BL at VDD (1V) or higher voltage (1.5V). This results in applying 2V or a more negative voltage to all the memory cells, de-trapping the charge. The de-trapped cells are the default state of 0 for next read, and may be reprogrammed to 1.

Figure 9:
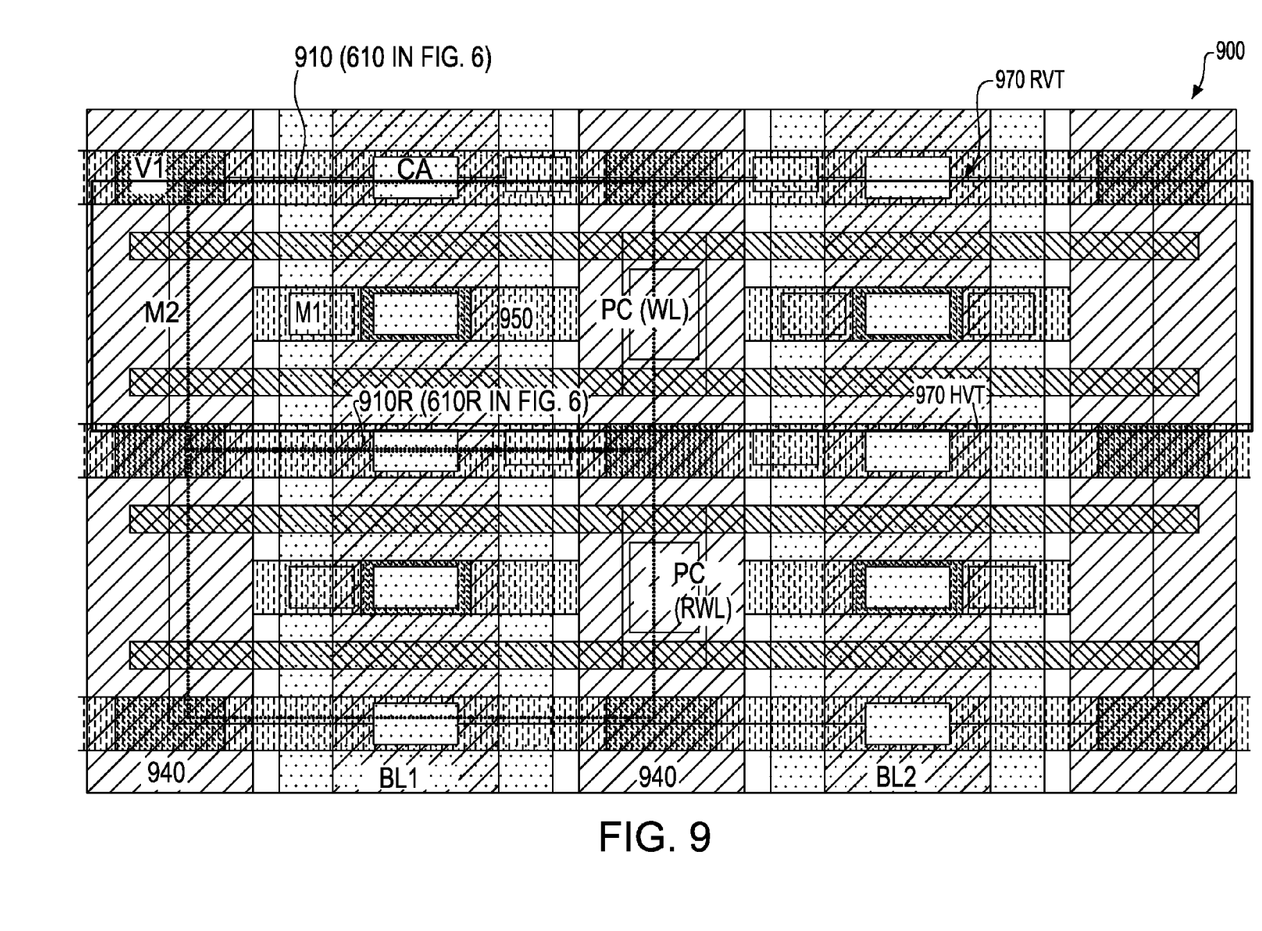
FIG. 9 illustrates a mask layout of the array structure for the eMTPROM, in accordance with the second preferred embodiment.

FIG. 9 shows a mask layout of the aforementioned second preferred embodiment, wherein NMOS cell (910) is a regular VT by the regular threshold voltage mask (RVT) (970RVT), and NMOS cell (910R) is a high VT by high threshold mask (HVT) (970HVT). The target for RVT and HVT threshold difference ranging between 100 and 150 mV to create an adequate differential voltage on the BL pair from top and bottom array during the sense operation without trapping a charge to NMOS (910)

All the cells (910) and reference cells (910R) are coupled to the same wordline (WL) and reference wordline (RWL) running to the first direction parallel to the gate poly (PC). The third metal M3 (not shown) runs over a contiguous PC and periodically stitched at the array break to reduce the poly gate delay time constant. NMOSs (910 and 910R) of the same column are coupled to the corresponding same bitline (i.e. BL1 and B12). BLs run to a second direction orthogonal to the WL and RWL (i.e., the first direction) using a second metal (M2). Ts source line (SL) is meshed in the entire array to create Meshed Source-Line Network (MSLN).

Figure 10:
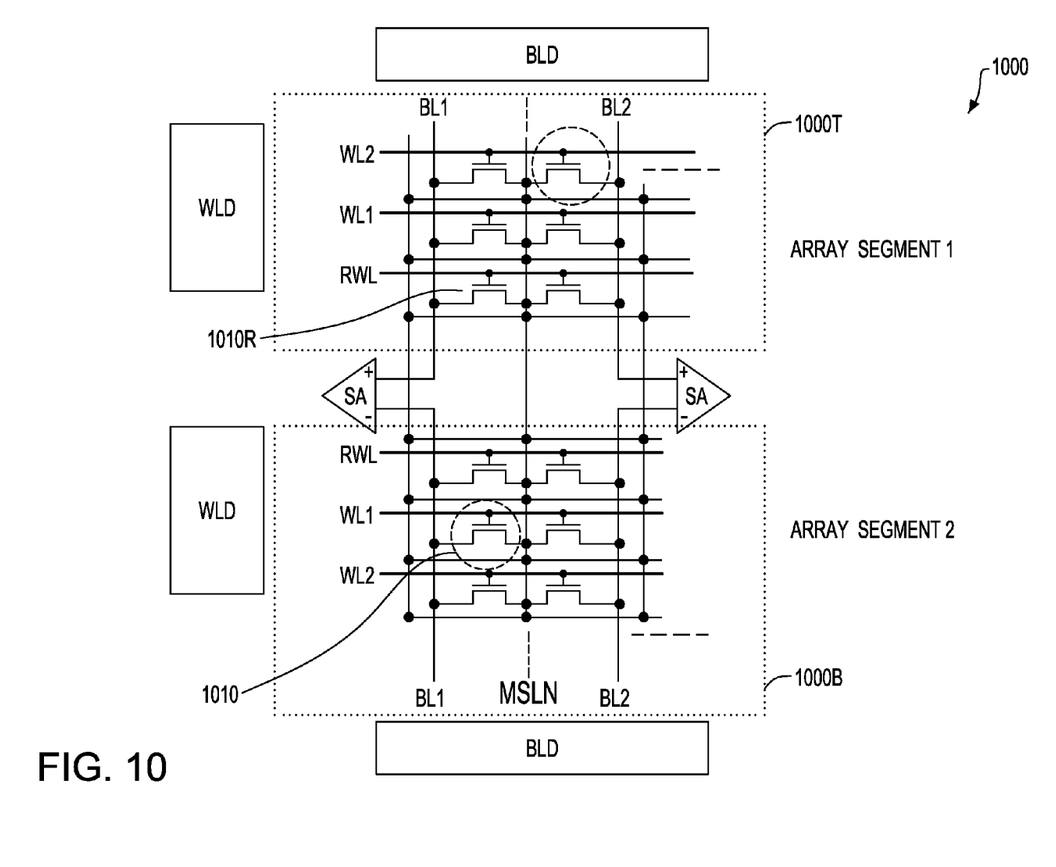
FIG. 10 illustrates the array structure of the eMTPROM, according to the third preferred embodiment.

FIG. 10 shows a third preferred embodiment to enable a default state. Similar to the aforementioned second embodiment, a third approach uses a single NMOS transistor per memory cell, improving the density. More particularly, the eMTPROM array (1000) consists of two sub-arrays (1000T and 1000B). Each sub-array (1000T and 1000B) consists of a plurality of memory cells, and each having a single NMOS transistor (1010). The NMOS of each sub-array (1000T and 1000C) are supported by wordlines (WLs) and bitlines (BLs) for selecting a row and a column in the respective cells. Each array consists of a reference wordline (RWL) coupled to NMOSs (1010R), each coupled to the corresponding BL. Unlike the second preferred embodiment, the threshold voltage (VT0) of NMOS(1000) is the same as that corresponding to NMOS (1010R). This can be realized by using a same implant mask preferably regular threshold voltage mask (RVT) for the 1010 and 1010R.

A write0 is not necessary because the default state of 0 is a non-trapped state of NMOS (1010) with VT0. Write1 is realized by trapping a charge to NMOS (1010). This can be realized by activating the corresponding wordline (1010) to 2V and discharging the bitline (i.e., BL1) to GND while raising the meshed-source-line-network (MSLN) to 1.5V. The unprogrammed bitline (i.e. BL2) maintains the MSLN voltage at 1.5V. This results in a large current only to NMOS (i.e., BL1), trapping the charge to the selected NMOS without trapping the charge to the unselected NMOS in the sub-array. Thus, this increases the NMOS threshold voltage (VT) by $\Delta$VT following the trapping.

When in a read mode, a wordline (i.e. WL1) is activated to VDD in one of the array (1000B). The reference wordline (RWL) is activated in the other array (1000T), the voltage thereof being lower than the activated WL of VDD by ½$\Delta$VT. Then, the pair of BLs (i.e., BL1) in both arrays is weakly discharged. The MSLN in a read mode stands at 1V that can result in generating a differential voltage (±½$\Delta$VT) on the BL pair. The differential voltage is sensed by a differential sense-amplifier (SA) coupled to the BLs from the top and bottom sub-array such that the output of SA is converted to 1 and 0 for the NMOS with and without trapping a charge, respectively. Additional bit flip function after the SA output may be required to match the data polarity for accessing the sub-array (1000T).

Figure 11:
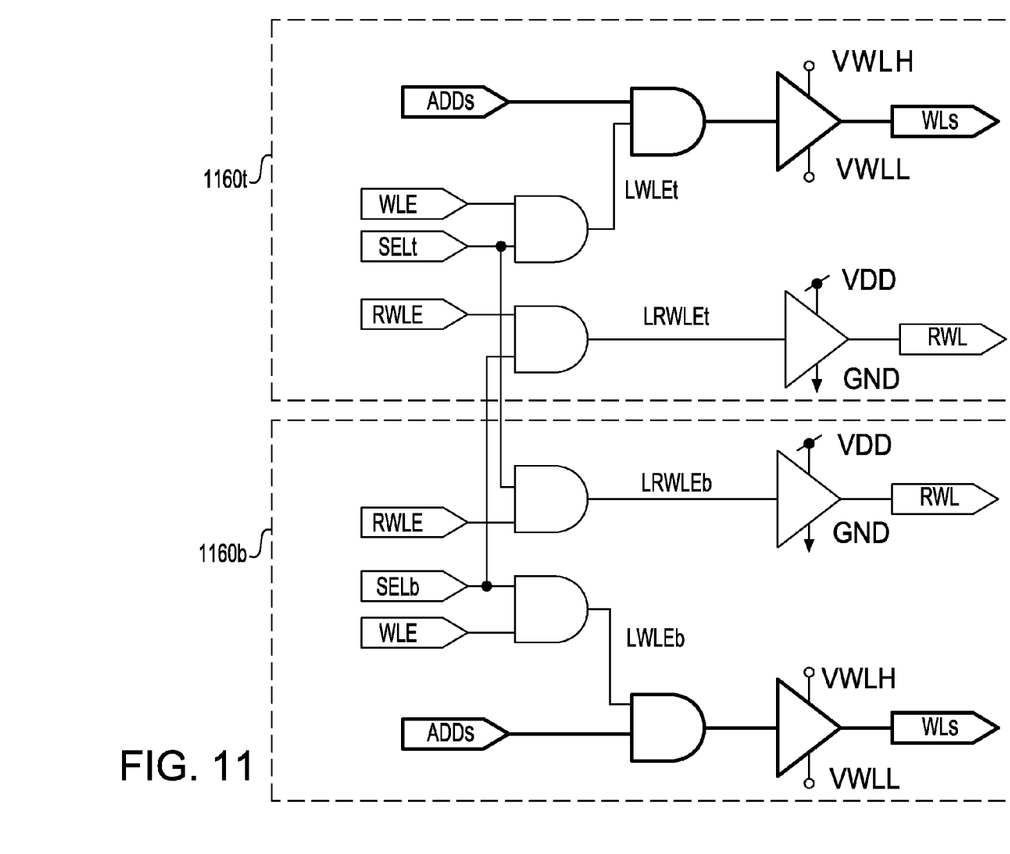
FIG. 11 shows a detailed schematic of the controlling the wordline (WL) and the reference wordline (RWL) of the sub-arrays (1000T and 1000B) shown in FIG. 10.

FIG. 11 shows a schematic to control wordlines (WLs) and reference wordline (RWL) in the top and bottom arrays, wherein the addresses (ADDs), the wordline enable signal (WLE), the reference wordline enable signal (RWL) are used for activating the corresponding WL and RWL in a sub-array selected by the corresponding signal (SELt and SELb), the operation thereof being the same as that shown in FIG. 8 applicable to the second preferred embodiment. Unlike the aforementioned second embodiment, reference wordline drivers (1105) of each sub-array control circuit (1060t and 1060c) are coupled to the reference wordline high voltage (RWLH) that is lower than VWLH in a read mode (=VDD) by ½$\Delta$VT, applicable to the third embodiment. The reset operation can be realized by lowering VWLL to −1V while keeping MSLN and BL at VDD (1V) or higher voltage (1.5V), that results in applying 2V or more negative voltage to all memory cells, detrapping the charge. The de-trapped cells are the default state of 0 for a next read, and can be reprogrammed to 1.

The third preferred embodiment has an additional advantage for checking a signal margin. Without programming the memory cell, the cell VT can be detected by changing the VRWLH voltage. When using an RVWLH higher than VDD (VWLH in a read mode) −½$\Delta$VT, a weak 0 default cell can be detected. Similarly, following the programming, by reducing VRWLH to VDD (or VWLH in a read mode)−½$\Delta$VT, a weak 1 programmed cell can be detected. Optionally, the VRWLH can be adjusted for optimizing the margin for 0 and 1, resulting in an improved signal margin for both cells.

While the present disclosure has been particularly shown and described with respect to preferred embodiments thereof, it will be understood by those skilled in the art that the foregoing and other changes in forms and details may be made without departing from the spirit and scope of the present disclosure. It is intended that the present disclosure not be limited to the exact forms and details described and illustrated, but fall within the scope of the appended claims.

What is claimed is:

1. An Embedded Multi-Time-Read-Only-Memory (eMT-PROM) comprising:
   an N-type Metal-Oxide-Semiconductor-Field-Effect-Transistor (NMOS) array consisting of a plurality of cells, each of said cells provided with a first NMOS having a first threshold voltage (VT1) and a second NMOS having a second threshold voltage (VT2), wherein said VT2 is higher than said VT1;
   wherein a default state is generated by developing a differential voltage on a first bitline coupled to said first NMOS, and a second bitline coupled to said second NMOS without trapping a charge to any of said NMOS, thereby enabling a differential sense amplifier coupling to said first and second bitlines.

2. The eMTPROM recited in claim 1, wherein said VT1 and said VT2 are determined by two different implant mask sets.

3. The eMTPROM recited in claim 1, wherein said VT2 is higher than said VT1 by a value ranging between 100 mV and 150 mV.

4. The eMTPROM recited in claim 1, wherein a level of said VT2 is programmed by trapping a charge to said second NMOS during manufacturing.

5. The eMTPROM recited in claim 1, wherein said default state changes to a second state by trapping a charge to said first NMOS wherein said VT1 is higher than said VT2.

6. A method of generating a default state comprising forming an array consisting of a plurality of cells, each of said cells having first NMOS having a first threshold voltage VT1 without trapping a charge and a second NMOS having a second threshold voltage VT2, wherein said VT2 is different from said VT1;

wherein generating said default state further comprises detecting a differential voltage of said VT1 and said VT2, and wherein said VT2 is higher than said VT1 by 100 mV to 150 mV; and wherein said first NMOS features an increase of said threshold voltage to a third threshold voltage (VT3), wherein said VT3 is higher than said VT2.

7. The method in claim 6, wherein said VT2 is adjusted to one-half of a sum of said VT1 and said VT3.

* * * * *